CONNECTOR FOR SECURING FLAT CONDUCTOR CABLE
TO PRINTED CIRCUIT BOARDS

Filed May 19, 1967 3 Sheets-Sheet 1

INVENTOR.
PHILIP J. HERB
BY Kenyon & Kenyon
ATTORNEYS.

INVENTOR.
PHILIP J. HERB
BY Kenyon & Kenyon
ATTORNEYS.

CONNECTOR FOR SECURING FLAT CONDUCTOR CABLE TO PRINTED CIRCUIT BOARDS

Filed May 19, 1967

INVENTOR.
PHILIP J. HERB
BY
Kenyon & Kenyon
ATTORNEYS.

United States Patent Office 3,500,289

Patented Mar. 10, 1970

3,500,289
CONNECTOR FOR SECURING FLAT CONDUCTOR CABLE TO PRINTED CIRCUIT BOARDS

Philip J. Herb, North Branch Station, N.J., assignor to Thomas & Betts Corporation, a corporation of New Jersey Filed May 19, 1967, Ser. No. 639,738
Int. Cl. H01r *31/08;* H05k *1/00*
U.S. Cl. 339—17 4 Claims

ABSTRACT OF THE DISCLOSURE

This invention relates to a connector which has particular application in fastening flat conductor cable to printed circuit boards and concomitantly aligning the individual conductors appropriately with the circuitry on the printed circuit board. Basically, the connector is comprised of a body member of dielectric material and a plurality of elastomeric strips adapted to protrude from the face of the connector body member. More particularly, the body member is provided with appropriately disposed slots adapted to accommodate the passage therethrough of flat conductor cable and pins extending therefrom to facilitate securement of the cable and fastener to the printed circuit board. Functionally, the fastener is designed to allow the passage of the flat conductor cable through the slots in such manner that the cable passes over the elastomeric strips which face the printed circuit board such that the cable will be compressed between the printed circuit board and the elastomeric strips when nut members are attached to the attachment pins to secure the entire assembly to the printed circuit board.

This invention relates generally to a device for fastening flat conductor cables to a printed circuit board and connecting the flat conductor cables to the circuitry of said printed circuit board.

In connecting flat conductor cable to the circuitry of printed circuit boards it is desirable to make the connection at a location on the board rather than at some location along the edge of the board. Economy of space and versatility both result when the connection of flat conductor cables to the circuitry of a printed circuit board can be made at a location on the board.

Presently, to effect connection of flat conductor cables to the circuitry of a printed circuit board at a location other than the edge, it is necessary to attach a post or peg at the location and solder the cable to the peg. Accordingly, it is an object of the present invention to provide a device to connect flat conductor cable to a printed circuit board.

Another object of the invention is to provide a simple light weight connector to facilitate connection of flat conductor cable to the circuitry of a printed circuit board at a location on the board.

It is another object of the invention to provide a device for securing flat conductor cable to a printed circuit board which will exert pressure on the entire width of the flat conductor cable therby providing positive contact between each of the conductors of the flat conductor cable and the appropriate conductors on the printed circuit board.

An additional object of the present invention is to provide a device for securing flat conductor cable to a printed circuit board which has the inherent capacity to exert positive pressure on all points along the entire width of the flat conductor cable regardless of difference in elevations on the flat conductor cable.

A further object of the present invention is to provide a device adapted to secure one member to another member and to impose a positive pressure at every point across the contact area regardless of differences in elevations.

It is also another object of the invention to provide a device of the above-described character which is capable of connecting on or more flat conductor cables to the circuitry of a printed circuit board.

In accordance with an aspect of the invention, the connector is formed of dielectric material, provided with slots through which the flat conductor cables pass and elastromeric strips which protrude from the lower connector face; i.e., the face presented to the printed circuit board. The connector is secured to the printed circuit board by pins extending therefrom which pass through apertures in the printed circuit board and nut members that grip the portion of the pins that protrude beyond the board. As a consequence, subsequently to the passage of the flat conductor cables through the slots in the connector and concomitant alignment with the circuitry of the printed circuit board, a sufficient tension force is exerted on the pins by proper installation of the nut members on the pins to thereby effect positive connection between the flat conductor cables and the circuitry on the printed circuit board.

Other objects and advantages of the invention will become apparent as it is described in detail below with particular reference to the accompanying drawings wherein, FIGURE 1 is an enlarged perspective view of the entire connector with a section of one of the rubber pad members cut away;

Figure 1:
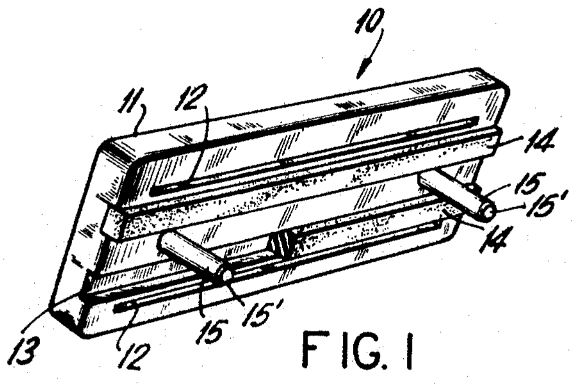
Figure 2:
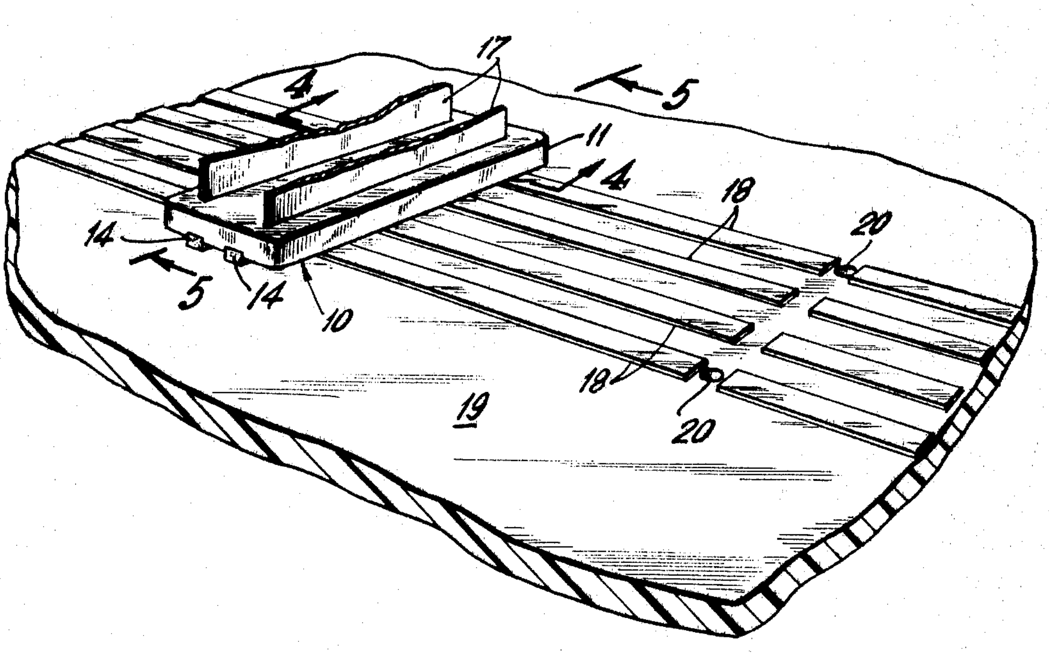
FIGURE 2 is a perspective view of the connector installed on a printed circuit board.
Figure 3:
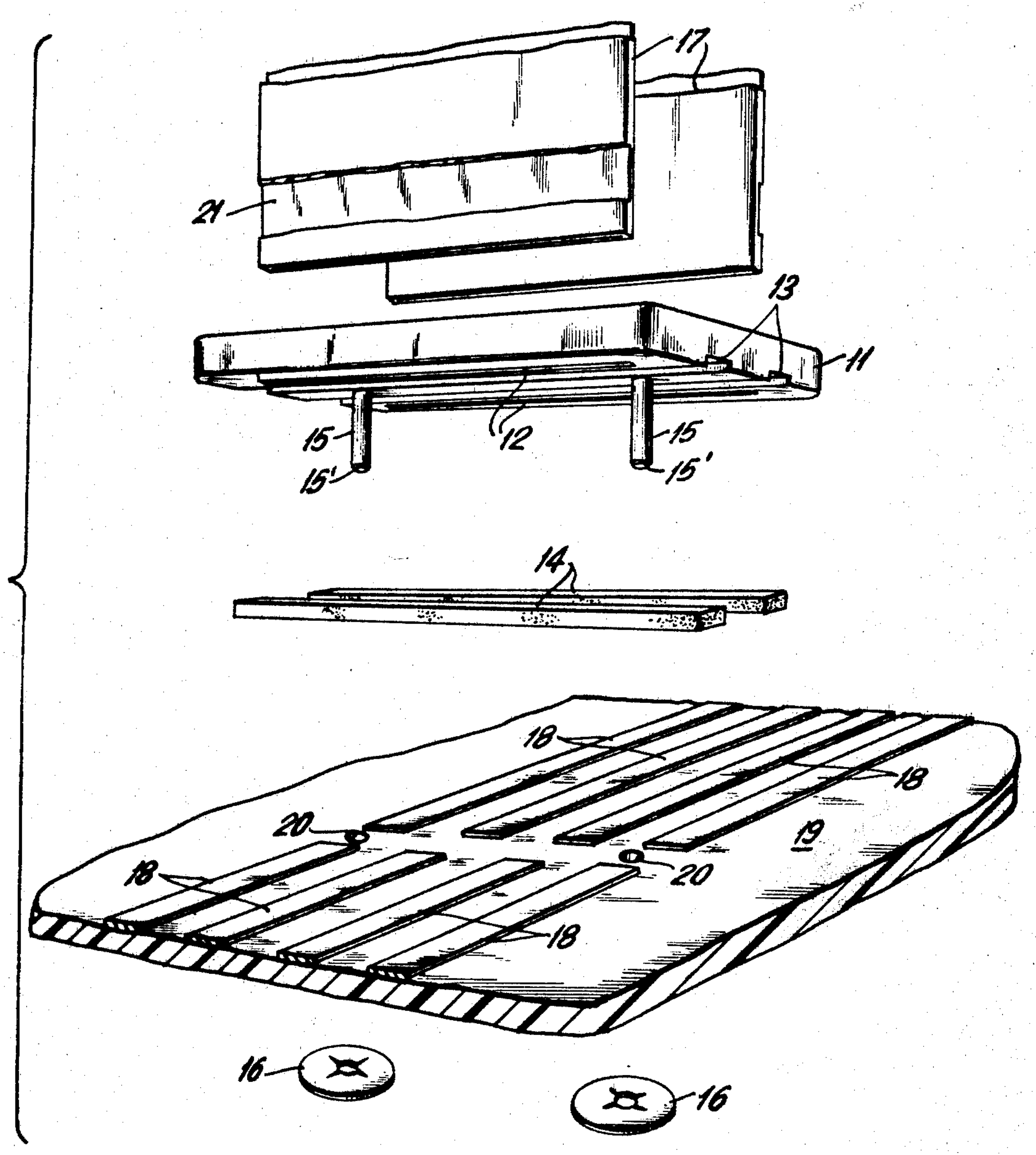
FIGURE 3 is an exploded view of the connector.

In general, the connector 10 of the present invention is adapted to rigidly connect and align the conductors 21 of the flat conductor cables 17 to the conductors 18 that are part of the printed circuitry formed on printed circuit board 19.

The connector 10 comprises a base member 11 having longitudinal slots 12 and recesses 13 formed therein and attachment pins 12 extending therefrom .The longitudinal recesses 13 extend the entire length of the base member 11 and are located in the lower face thereof; i.e., that face which is presented to the printed circuit board 19. Rubber pads 14 sized to occupy each recess 13 entirely and protrude downwardly are fixedly secured in the recess 13 by cement or any other appropriate adhesive. This design provides a resilient means by which the flat conductor cable 17 and individual conductors 21 associated therewith can be firmly pressed against the conductors 18 on the circuit board 19 to insure the imposition of positive pressure along the width of the flat conductor cable 17 regardless of any elevational differences. Alignment pins 15 with an annular bevel 15' extend from the lower face of base member 11 and are employed to effect attachment to circuit board 19 with cooperating nuts 16.

Figure 4:
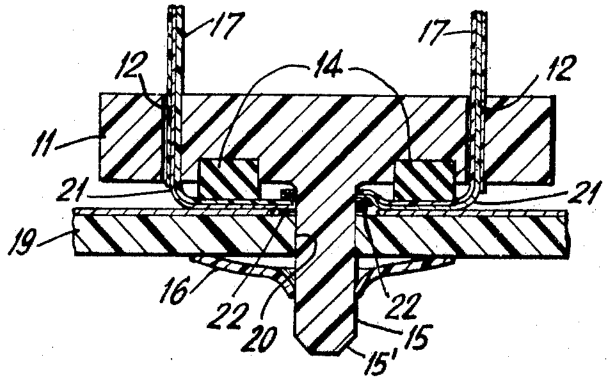
FIGURE 4 is a view along line 4—4 of FIGURE 2.
Figure 5:
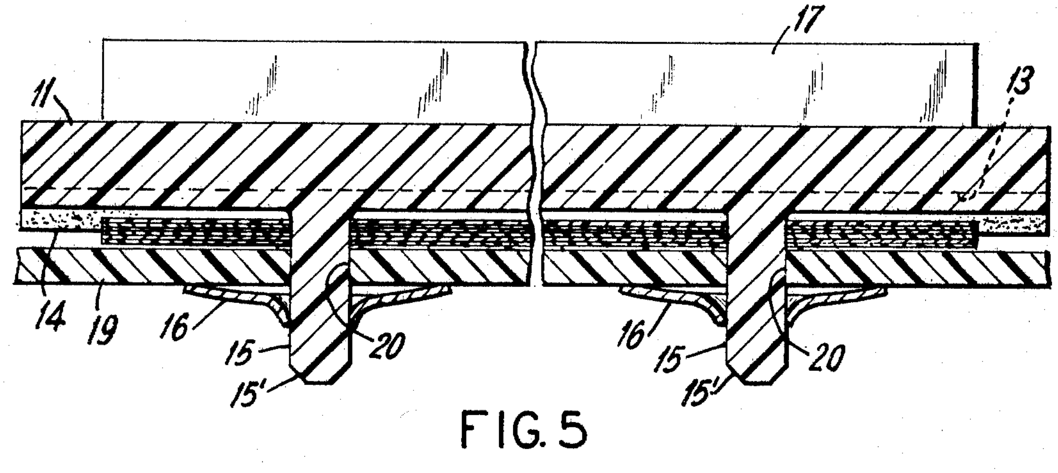
FIGURE 5 is a view along line 5—5 of FIGURE 2.

Connection of the conductors 21 of the flat conductor cables 17 to the conductors 18 of the circuit board 19 is effected by first stripping insulation from one side of the flat conductor cable 17 to expose a sufficient portion of the conductors 21 to contact the conductors 18 directly, then passing the flat conductor cables 17 through the slots 12. A sufficient amount of cable 17 must pass through each slot 12 to allow the extremity to extend beyond apertures 20 thereby enabling the pins 15 to transpierce said extremity, as best seen in FIGURES 4 and 6, to effect alignment of the conductors 21 of cables 17 with conductors 18 of the circuit board 19.

After to the passage of the pins 15 through both the extremity of cable 17 and apertures 20, Tinnerman nuts 16 or the like are secured thereto to provide a tension force on said pins 15 which, in turn, react that same force compressively on rubber pads 14 to positively maintain the entire assembly in the desired alignment.

Figure 6:
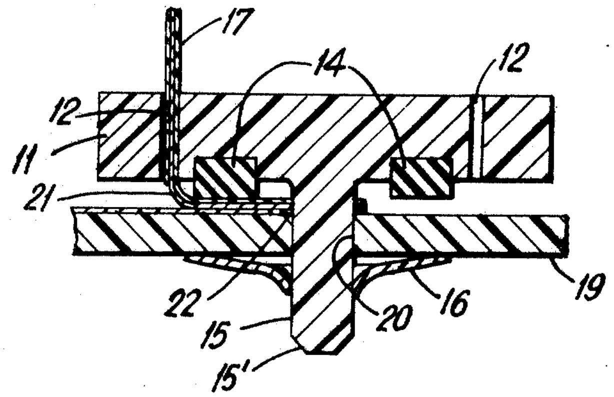
FIGURE 6 is a sectional view of the installed connector similar to FIGURE 4 showing only a single flat cable connected to the printed circuit board.

The alternative embodiment depicted in FIGURE 6, shows a single rather than plural connection.

As an alternative construction, the recesses 13 in base member 11 of connector 10 may be omitted with the rubber pads 14 then being secured to the face of base member 11.

While this invention has been described in connection with certain specific embodiments thereof, it is to be understood that this has been done merely for purposes of illustration and various changes and modifications may be effected therein without departing from the scope or spirit of the invention.

What I claim is:

1. A dielectric connector for connecting flat conductor cables to the circuitry of a printed circuit board comprising a substantialy rectangular and substantially thin base member of dielectric material, said member having an upper surface and a lower surface, said base member having elongated slots substantially adjacent the longitudinal edges thereof and extending between said upper and lower surfaces of said member, at least one elastomeric strip secured to said lower surface of said member between said slots and extending beyond said lower surface and at least one pin extending from said lower surface of said member and positioned intermediate said slots for securing said member to a printed circuit board.

2. The connector of claim 1 wherein said base member has a pair of longitudinally extending elastomeric strips secured to said lower surface of said member between said slots and extending beyond said lower surface and wherein said base member has a pair of pins extending beyond said lower surface of said member and positioned intermediate said elastomeric strips for securing said member to a printed circuit board.

3. The connector of claim 1 wherein said lower surface of said member is provided with a pair of longitudinally extending recesses, a portion of each of said elastomeric strips occupying one of said recesses.

4. The connector of claim 3 wherein said elastomeric strips are of rubber material.

References Cited

UNITED STATES PATENTS

| | | | |
|---|---|---|---|
| 2,854,502 | 9/1958 | Richter. | |
| 3,065,444 | 11/1962 | Crimmins. | |
| 2,965,812 | 12/1960 | Bedford | 317—101 |
| 3,319,216 | 5/1967 | McCullough. | |
| 3,336,564 | 8/1967 | McCaughey | 339—99 |

FOREIGN PATENTS

| | | |
|---|---|---|
| 700,490 | 12/1953 | Great Britain. |

RICHARD E. MOORE, Primary Examiner

PATRICK A. CLIFFORD, Assistant Examiner

U.S. Cl. X.R.

339—19